United States Patent [19]
Hoppe et al.

[11] Patent Number: 5,986,890
[45] Date of Patent: *Nov. 16, 1999

[54] SEMIFINISHED PRODUCT WITH AN ELECTRONIC MODULE

[75] Inventors: Joachim Hoppe; Arno Hohmann, both of Munich, Germany

[73] Assignee: Giesecke & Devrient GmbH, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/622,874

[22] Filed: Mar. 29, 1996

Related U.S. Application Data

[63] Continuation of application No. 08/577,020, Dec. 22, 1995, abandoned.

[51] Int. Cl.⁶ ..................................................... H05K 1/14
[52] U.S. Cl. ........................ 361/737; 361/758; 361/770
[58] Field of Search .................................. 361/736, 737, 361/742, 748, 749, 752, 758, 770; 235/380, 492, 441, 439, 487

[56] References Cited

U.S. PATENT DOCUMENTS

| | | | |
|---|---|---|---|
| 4,474,292 | 10/1984 | Haghiri-Tahrani et al. | 206/716 |
| 4,999,742 | 3/1991 | Stampfli | 361/782 |
| 5,013,900 | 5/1991 | Hoppe | 235/492 |
| 5,428,214 | 6/1995 | Hakkers et al. | 235/492 |

FOREIGN PATENT DOCUMENTS

| | | |
|---|---|---|
| 0 570 062 | 11/1993 | European Pat. Off. . |
| WO 92/21105 | 11/1992 | WIPO . |

*Primary Examiner*—Leo P. Picard
*Assistant Examiner*—Phuong T. Vu
*Attorney, Agent, or Firm*—Bacon & Thomas, PLLC

[57] ABSTRACT

A semifinished product for an electronic module includes an integrated circuit and a coil electrically connected with the circuit, the coil being disposed between two carrier layers and the integrated circuit being disposed in a specially provided cavity in the two carrier layers. To achieve plane surfaces of the semifinished product, the remaining cavity between the carrier layers and the integrated circuit is filled with a filling material in such a way that plane surfaces of the semifinished product result in the area of the cavity which are flush with the surfaces of the carrier layers.

4 Claims, 2 Drawing Sheets

SEMIFINISHED PRODUCT WITH AN ELECTRONIC MODULE

This application is a continuation of U.S. patent application Ser. No. 08/577,020 filed Dec. 22, 1995 now abandoned.

BACKGROUND OF THE INVENTION

1. Field of the Invention

This invention relates to a semifinished product suitable for installation in a data carrier with an electronic module comprising at least an integrated circuit and a coil electrically connected with the circuit, the coil being disposed between two carrier layers and the integrated circuit being disposed in a specially provided cavity in the two carrier layers.

2. Description of Related Art

Semifinished products of the abovementioned type have been known for some time. They are used for producing data carriers which are used for example as key cards in the in-house area. The power supply to the electronic module and/or the data exchange with external devices takes place in noncontacting fashion via the coil.

Such a semifinished product with an electronic module is known for example from WO 92/21105. The semifinished product consists of two card layers laminated one on the other. One of the layers has suitable depressions in the form of blind holes for receiving the integrated circuit and the coil electrically connected with the circuit, whereby the second layer seals the depressions with the integrated circuit disposed therein and the coil. The data carrier is completed from the semifinished product by laminating cover layers on both sides of the semifinished product.

In the semifinished product shown, an integrated circuit is located in a cavity in the card layers. Since the integrated circuit does not completely fill the cavity in question, there is often undesirable deformation of the cover layers in the area of the cavity in the completed data carrier.

SUMMARY OF THE INVENTION

Starting out from the stated prior art the invention is therefore based on the problem of providing a semifinished product for producing a data carrier with which one can obtain data carriers with completely plane cover layers.

The basic idea of the invention is to be seen in filling the remaining cavity between the carrier layers and the integrated circuit with a filling material in such a way as to yield plane surfaces of the semifinished product in the area of the cavity which are flush with the surfaces of the carrier layers.

In one embodiment of the semifinished product, the electronic module is embedded between two carrier layers. The semifinished product is suitable for producing data carriers with very plane surfaces which can be produced by laminating cover layers on the semifinished product. The coil is located in said semifinished product between the carrier layers, while the integrated circuit is disposed in a specially provided cavity in the two carrier layers. The remaining cavity between the integrated circuit and the layers is filled with a filling material so that the semifinished product has completely plane surfaces. The carrier layers preferably have the same thickness. In addition depressions can be formed in the carrier layers so as to form a channel which at least partly receives the coil. The channel can be filled partly with filling material.

Along with the electronic module for noncontacting data exchange, an electronic module for contacting data exchange, comprising at least contact surfaces and an integrated circuit electrically connected with the contact surfaces, can additionally be housed in a further cavity in the carrier layers. The remaining cavity between the module and the carrier layers is likewise filled with a filling material here.

Further advantages and developments will result from the description, the subclaims, and the figures which are explained in the following.

DETAILED DESCRIPTION OF THE PREFERRED EMBODIMENTS

FIGS. 1 to 6 show an inventive semifinished product in cross section which has a cavity in one area. All embodiments have in common that the cavity is filled with a filling material in such a way that the semifinished product has plane surfaces. The semifinished products shown in FIGS. 1 to 6 can thus be provided with cover layers without the latter being noticeably deformed in the area of the cavity. This has the advantage that the cover layers can be provided altogether or in certain areas with an element which requires a plane surface for certain reasons. Such an element can be e.g. a hologram whose optical effect is based on fine structures which can be disturbed by a nonplane surface. A further such element is a magnetic stripe whose data can only be read reliably with a reading head if the stripe is located in a plane surface. Further elements are conceivable.

Figure 1:
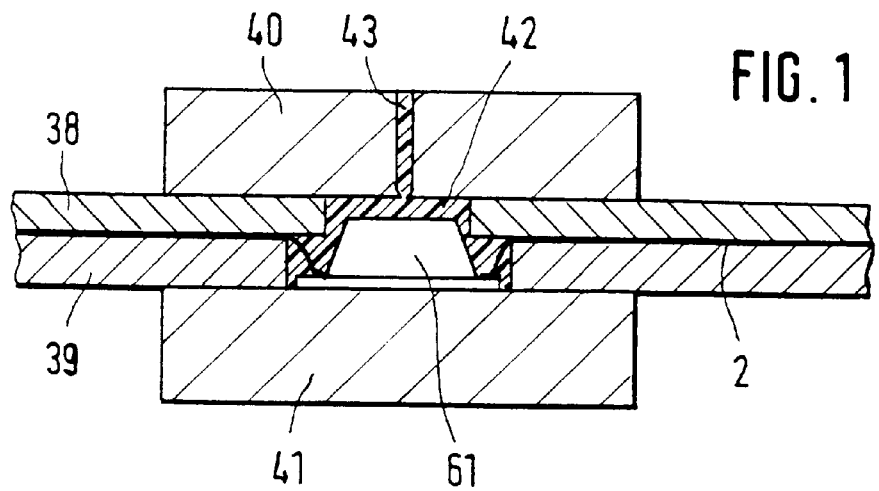
FIGS. 1 to 6 each show a sectional view through a semifinished product wherein the coil is fixed between two carrier layers.

FIG. 1 shows the semifinished product in a filling station. The semifinished product includes carrier layers 38 and 39 between which coil 2 is located. The ends of coil 2 are electrically connected with chip carrier 61 in the interior of which integrated circuit 4 is located (not shown here). Chip carrier 61 is disposed in an opening in carrier layers 38 and 39. The remaining cavity is filled with filling compound 42 in such a way that plane surfaces also result in the area of the opening, being flush with the external surfaces of layers 38 and 39, as shown in the figure. Filling compound 42 may be one of a great variety of materials, for example casting resins curing under heat and UV-light, or thermoplastic materials, etc.

The production of a semifinished product as just described takes place as follows. The electronic module consisting of coil 2 and chip carrier 61 electrically connected with the ends of the coil is placed on layer 39 so that chip carrier 61 is disposed in the specially provided opening in layer 39. The opening can be punched for example. Layer 38 is then laminated on layer 39. This can be done for example under the action of heat and pressure. The layers can also be laminated together by the ultrasonic welding method well known to the expert. This has the advantage that the coils function as current direction transmitters, so that the carrier layers are welded together especially well and no cavities remain between the coil wires. After layer 38 is laminated on, the laminate is placed between filling station halves 40 and 41 (cf. FIG. 1) and the remaining cavity between chip carrier 61 and the openings in layers 38 and 39 filled with filling compound 42 by injecting filling compound 42 into the remaining cavity through gate 43. This can preferably be done under elevated pressure, which ensures that the entire remaining cavity is filled with filling compound. The filling station can additionally be used, before the cavity is filled, to interconnect carrier layers 38 and 39, e.g. under the action of heat and pressure. In this case at least one of the filling station halves is heatable. The filling station halves are preferably made of metal, but can also be adapted to particular filling material 42 and be made e.g. of a UV transmitting material if UV-curing casting compound is used.

A plurality of filling stations can of course also be disposed side by side and described layers 38 and 39 exist in the form of long strips which are cut into proper lengths only shortly before completion of the data carrier.

Figure 2:
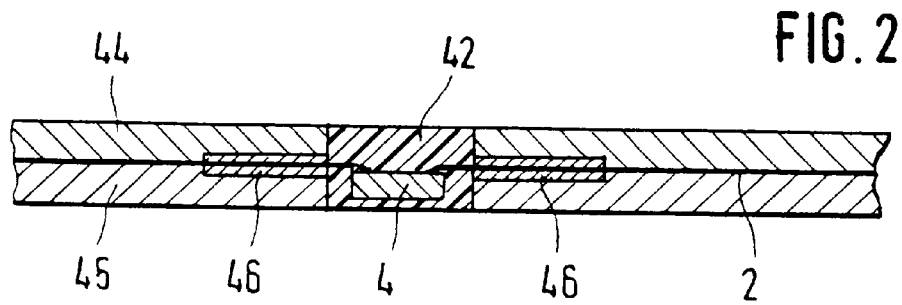

FIG. 2 shows a first development of the semifinished product in cross section. The electronic module includes coil 2 and integrated circuit 4 electrically connected directly therewith. Carrier layers 44 and 45 have not only the openings for integrated circuit 4 but also depressions 46 which form a channel for a partial area of the coil and can be produced for example by injection molding. The depressions serve to receive surplus filling material 42. The production of the semifinished product takes place as in the abovementioned method.

Figure 3:
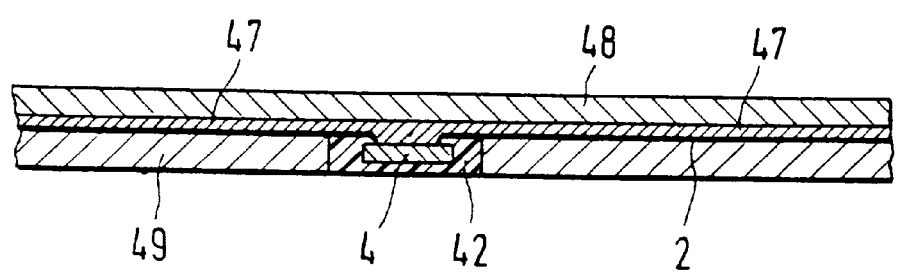

FIG. 3 shows a second development of the semifinished product in cross section. The semifinished product corresponds substantially to that in FIG. 2. However depressions 47 forming the channel for the coil are formed for entire coil 2, so that the entire coil extends in a channel. The remaining cavity in depressions 47 is filled at least partly with filling material 42. Furthermore layer 48 has no opening for receiving the integrated circuit. The production of the semifinished product likewise takes place substantially as in the method described in connection with FIG. 1. However filling material 42 is injected from below here.

Figure 4:
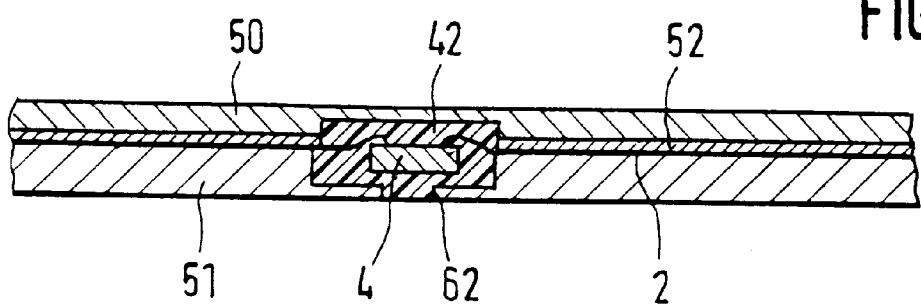

FIG. 4 shows a third development of the semifinished product in cross section, which corresponds substantially to that in FIG. 3. In contrast to that shown in FIG. 3, a depression for receiving integrated circuit 4 is provided here in upper carrier layer 50. Furthermore lower carrier layer 51 has a depression for receiving integrated circuit 4 as well as opening 62 for filling in filling material 42. The production takes place as in the method described in connection with FIG. 3.

Figure 5:
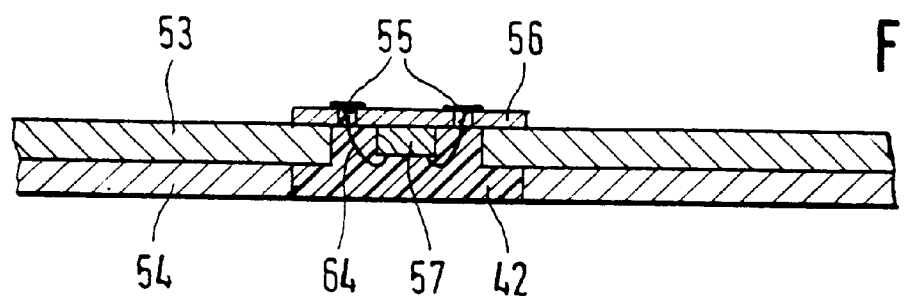

FIG. 5 shows a fourth development of the semifinished product in cross section. In addition to the noncontacting electronic modules for noncontacting data exchange, a second electronic module for contacting data exchange is disposed in a further opening in the carrier layers. The electronic module consists of integrated circuit 57 which is fastened to carrier substrate 56 and electrically connected through openings in carrier substrate 56 via bonding wires 64 with contact surfaces 55 located on the side of the carrier substrate opposite circuit 57. Installation takes place e.g. after installation of the noncontacting electronic module. Carrier substrate 56 is connected with card layer 53 in such a way that integrated circuit 57 and conductive connections 64 are located in the specially provided openings in layers 53 and 54, as also shown in FIG. 5. The remaining cavity in the openings in card layers 53 and 54 is then filled with filling compound 42 from the side facing away from the electronic module by the method described above. This fixes the electronic module in the opening in card layers 53 and 54. Especially good fixation of the electronic module is obtained if the opening in layer 54 is greater than the opening in layer 53. In this case layer 53 is encompassed by carrier substrate 56, on the one hand, and by filling compound 42, on the other hand, as shown in FIG. 5, so that the electronic module is protected well from forces acting perpendicular to layers 53 and 54.

Figure 6:
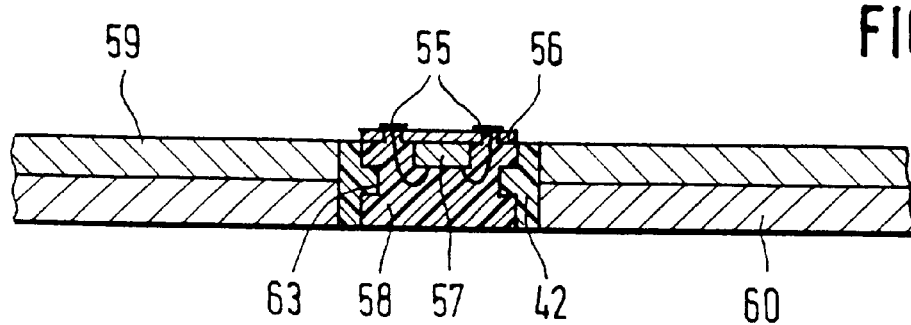

FIG. 6 shows a fifth development of an inventive semifinished product. It too has not only the noncontacting modules installed according to FIGS. 1 to 4 but also an electronic module for contacting communication inserted in an opening in carrier layers 59 and 60. The electronic module for contacting communication is constructed substantially like that shown in FIG. 5. However the integrated circuit is additionally surrounded with casting compound 58, which can consist of materials well known to the expert. The casting compound has groove 63 so that the electronic module for contacting communication is fixed better in the opening in the carrier layers.

Starting out from the semifinished products shown in FIGS. 1 to 6 one can complete the data carrier by laminating cover layers to the exposed planar surface of the filling material and carrier layers on both sides of the semifinished product. Should electronic modules for contacting communication be installed in the semifinished product according to FIG. 5 or 6, the corresponding cover film has an opening in the area of carrier substrate 56. The thickness of the upper cover film should then be chosen so that it ends flush with the surface of carrier substrate 56.

The invention is of course not restricted to the abovementioned embodiments. It also covers mixtures of the individual components.

We claim:

1. A semifinished product which can be used in the production of a data carrier, comprising at least an integrated circuit and a coil electrically connected with the circuit, the coil being disposed between two carrier layers and the integrated circuit being disposed in a specially provided cavity in the two carrier layers, wherein a remaining portion of the cavity between the carrier layers and the integrated circuit is filled with filling material such that a surface of said filling material is flush with a surface of the carrier layers to form an exposed planar surface of the semifinished product, said exposed planar surface of the semifinished product having horizontal dimensions corresponding to those of a data carrier so that at least one cover layer can be laminated to said semifinished product during said production of the data carrier in order to complete production of the data carrier.

2. The semifinished product of claim 1, wherein a channel is provided at least in one of the carrier layers, said channel containing at least parts of the coil and being filled at least partly with the filling material.

3. The semifinished product of claim 1, further comprising a contacting electronic module for contacting communication, said contacting electronic module comprising at least contact surfaces and an integrated circuit electrically connected with the contact surfaces is additionally provided in a further cavity in the carrier layers, a remaining portion of the further cavity between the contacting electronic module and the carrier layers being filled with a filling material.

4. The semifinished product of claim 3, wherein at least the integrated circuit of the contacting electronic module is additionally cast with a casting compound.

* * * * *